United States Patent [19]

Konsevich

[11] Patent Number: 4,647,245

[45] Date of Patent: Mar. 3, 1987

[54] RESILIENT BUSHING AND PIN INSTALLATION FOR USE WITH VIBRATION SENSITIVE EQUIPMENT

[75] Inventor: Francis X. Konsevich, Federal Way, Wash.

[73] Assignee: The Boeing Company, Seattle, Wash.

[21] Appl. No.: 536,952

[22] Filed: Sep. 27, 1983

[51] Int. Cl.[4] .................................................. F16D 1/00
[52] U.S. Cl. ..................................... 403/228; 248/632
[58] Field of Search .............. 403/228, 225, 226, 221, 403/222, 224; 248/632, 634, 635

[56] References Cited

U.S. PATENT DOCUMENTS

| 1,883,893 | 10/1932 | Flaherty | 248/632 |
| 2,115,653 | 4/1938 | Snyder | 248/635 |
| 2,689,755 | 9/1954 | Krotz | 403/221 |
| 2,827,281 | 3/1958 | Cooney | 403/228 X |
| 4,067,525 | 1/1978 | Allen | 248/632 |
| 4,158,511 | 6/1979 | Herbenar | 403/228 X |

FOREIGN PATENT DOCUMENTS

| 997611 | 9/1951 | France | 403/228 |
| 266724 | 5/1950 | Switzerland | 403/225 |
| 616243 | 1/1949 | United Kingdom | 248/635 |
| 1063863 | 3/1967 | United Kingdom | 16/2 |

Primary Examiner—Andrew V. Kundrat
Attorney, Agent, or Firm—Delbert J. Barnard; Bruce A. Kaser

[57] ABSTRACT

A metal block (14) is secured to a first member. The metal block (14) includes a first bore (30) separated from a second bore (46) by a radial wall (26) having a central opening (34). A sleeve of elastomeric material (16) is formed between bore 30 and a longitudinally split bushing (18) centered within bore (70). An elongated pin portion (54) of a pin element (12) is plugged into a socket (10) interior of the bushing (18). The pin portion (54) radially expands the bushing (18) against the elastomeric material (16). This provides a tight frictional engagement between the bushing (18) and the pin portion (54). It also results in the bushing (18) and the pin element (12) moving together in response to vibrations, and results in the elastomeric material (16) absorbing the vibrations. Pin element (12) is either connected to a second member or includes a tapered projecting end portion (74) sized to engage an opening (82) in a second member (80).

18 Claims, 8 Drawing Figures

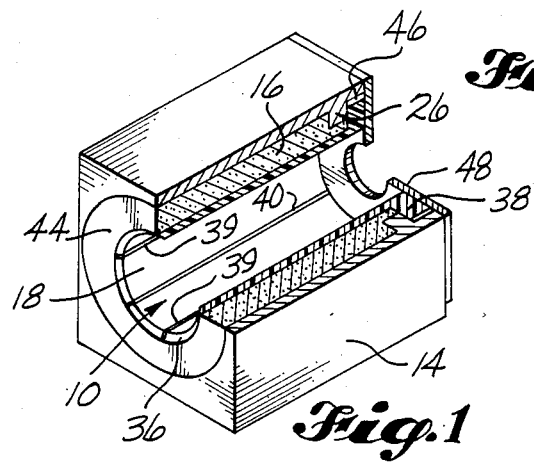
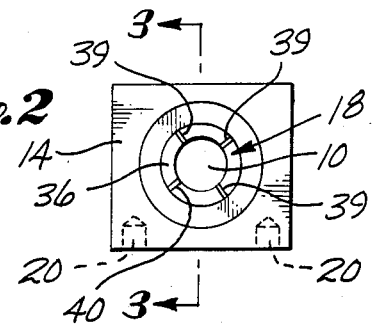
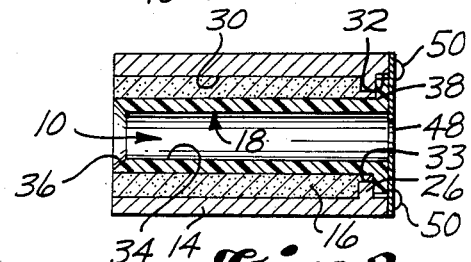
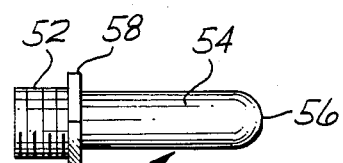
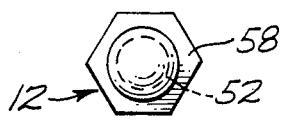
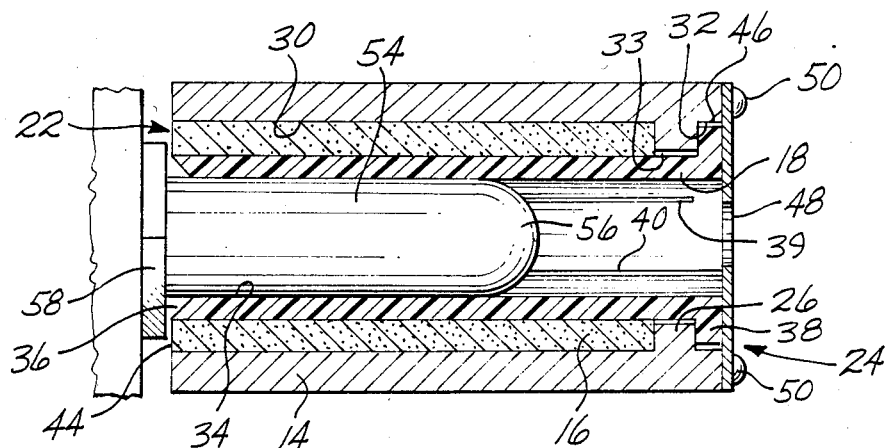

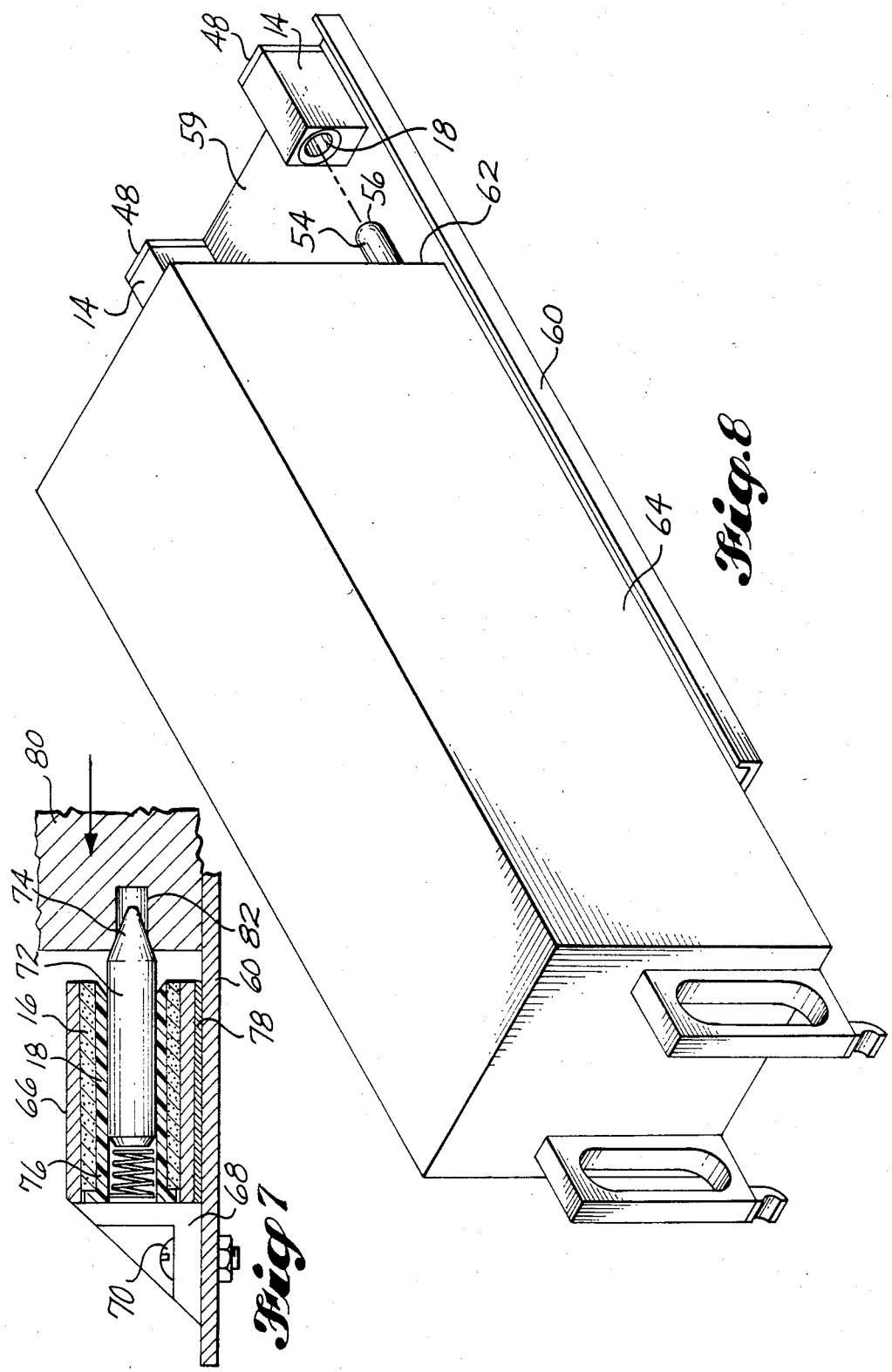

RESILIENT BUSHING AND PIN INSTALLATION FOR USE WITH VIBRATION SENSITIVE EQUIPMENT

TECHNICAL FIELD

This invention relates to pin and bushing type installations of electronic equipment. More particularly, it relates to the provision of an improved pin and bushing type connection for use in the installation of vibration sensitive equipment without the problems associated with known systems which are presently used for such equipment.

BACKGROUND INFORMATION

A pin and bushing type of connection is a desired way of easily and quickly attaching an item, such as an electronic unit, etc. to a structural body, housing, frame, tray, etc. This is because one of the two members which are to be connected together carries a pin and the other carries the bushing. The connection is easily made by inserting the pin into the bushing. The parts are disconnected by merely pulling them apart. To make this type of system work there must be a tight frictional grip established between the pin and the bushing.

There are three primary problems experienced when pin and bushing connections are used. Firstly, mechanical impacting results in the transmission of excessive dynamic loads to installed equipment. Secondly, there is excessive wear of the mating surfaces between the pin and the socket. Thirdly, there is a too frequent failure of mechanical hardware in the installation.

Prior attempts to solve these problems have involved the use of various metallic combinations in the installation. These attempts have been unsuccessful due to the induction of dynamic loads into the installed equipment. These dynamic loads cause mechanical wear and eventual failure of components of the installation.

The present invention was made while developing a pin and bushing type of installaton for use with vibration sensitive equipment.

DISCLOSURE OF THE INVENTION

The present invention is basically characterized by a housing which is adapted to be connected to a first member. An elongated sleeve of elastomeric material is retained within an elongated cavity that is formed in the housing. An elongated, longitudinally split, plastic bushing is snugly received within the sleeve of elastomeric material. The interior of the plastic bushing functions as a bushing for an elongated pin portion of a metallic pin element. The pin element is secured to a second member which is to be attached to the first member.

The pin portion of the pin element is larger in cross sectional dimension than the bushing socket. This results in the bushing being radially expanded when the pin portion is inserted into the bushing socket. Expansion of the bushing causes the elastomeric material around it to be compressed, resulting in the development of the frictional gripping forces which are necessary for holding the bushing and the pin portion of the pin element tightly together. In accordance with the invention, once the pin portion of the pin element is positioed inside of the socket, the mechanical movement between the pin portion and the bushing is essentially arrested. Vibration forces acting on the connection are transmitted through the elastomeric material. Vibration forces acting on the bushing and the pin element will cause them to move together relative to the housng, but buffered by the elastomeric material.

Various other constructional details of the elements which make up the connection of this invention are important and constitute other aspects of the invention. These details are hereinafter described in the description of the illustrated embodiment, and are hereinafter particularly pointed out and distinctly claimed in the claims. Accordingly, the description of the best mode for the preferred embodiment, and the appended claims also constitute portions of the disclosure of the invention.

BRIEF DESCRIPTION OF THE DRAWINGS

Like reference numerals are used to denote like parts throughout the several views of the drawings, and:

FIG. 1 is a pictorial view of a pin block assembly, with a foreground quarter section of the assembly removed, for clarity of illustration of the several parts of the assembly and the manner in which they are connected together;

FIG. 2 is an end view of the pin block assembly, looking towards the pin receiving end of the assembly;

FIG. 3 is a longitudinal sectional view taken substantially along line 3—3 of FIG. 2;

FIG. 4 is a side view of the pin element;

FIG. 5 is an end view of the pin element, looking towards the threaded base end of the element;

FIG. 6 is an enlarged scale view like FIG. 3, but showing the pin inside the bushing socket, and showing the sleeve of elastomeric material radially expanded from the position it occupies when the pin is not inside the socket;

FIG. 7 is a view like FIG. 6, but of a modified embodiment of the invention, involving a pin which is interference fit into the longitudinally split bushing, and which includes a projecting end portion which engages an opening in the member that is to be mounted; and FIG. 8 is a pictorial view of a typical assembly of a resilient pin block assembly and equipment item.

BEST MODE FOR CARRYING OUT THE INVENTION

As illustrated, the connection of the present invention comprises two elements. The first element provides a pin receiving socket 10. The second element is a pin element 12.

The first element includes a housing 14 which is fabricated to include an inner cavity which receives an elastomeric sleeve 16 and a plastic bushing 18 which is located within the sleeve 16.

Housing 14 may be constructed from metal. In preferred form, housing 14 is a block of metal which has been machined to form the aforementioned inner cavity. Housing or block 14 may be drilled and tapped at 20, to provide threaded sockets for receiving the threaded end portion of mounting screws used to secure the housing 14 to a first member.

Housing 14 includes a first end 22 and a second end 24. A radial wall or flange 26 projects radially inwardly from a sidewall 30. In preferred form, a first long bore 30 is formed by boring into the block from the first end 22. A second much shorter bore 32 is formed by boring into the block from the second end 24. The radial wall or flange 26 is formed by the material that is left between the two bores 30, 32. Wall 26 is drilled to define a central opening 33.

The plastic bushing 18 includes an elongated body portion 34. Bushing 18 includes first and second ends 36, 38. End 36 is open to provide access into the interior of the bushing 18, which functions as a socket for receiving a pin, as will hereinafter be described. As shwon by FIGS. 1–3 and 6, the first end 36 of bushing 18 is beveled, so as to provide a smooth entrance into the socket 10. The opposite end 38 of bushing 18 includes an outwardly directed radial flange.

As shown by FIGS. 1 and 2, the bushing 18 is split axially at 40. Split 40 extends the full length of bushing 18, including through the region of flange 38. In addition, the bushing is split at three other equally positioned locations 39 (FIGS. 1 and 2) up to the flange 38.

The assembly which includes housing 14 may be termed a pin block assembly. The pin block assembly is put together in the following manner. Firstly, a forming pin (not shown) which is substantially the same size as the center opening through the bushing 18 is installed into a bushing 18. Then, the bushing 18 is wrapped with light thread or the like to conform it to the forming pin. The bushing, with pin inside, is then installed through the end 24 of the housing 14. Then, the elastomeric sleeve 16 is cast in place about the bushing 18. For example, an elastomeric silicone is injected into the annular space between the bushing 18 and the bore 30 in housing 14.

As is clearly shown by FIGS. 1, 3 and 6, when the bushing 18 and the elastomeric sleeve 16 are within housing 14, the elastomeric sleeve 16 presents an end surface 44 which is substantially flush with the end surface of housing 14 at the first end 22. The beveled entry 36 into the socket 10 is also located at the end of housing 22. The flange 38 is substantially against the wall 26, but a radial space 46 exists between the outer periphery of flange 38 and the inner surface of the second bore 32.

A cover or retention plate 48 is provided over the second end 24 of housing 14. Plate 48 may be secured in place by means of screw type fasteners 50, or the like.

As will be evident from an inspection of FIGS. 1, 3 and 6, the interference between the two flanges 38 and 26 prevents the bushing 18 from moving endwise out from within the housing 14. The retention plate 48 prevents bushing 18 from moving endwise out through the opposite end of the housing 14. However, the bushing 18 is able to expand a controlled amount in the radial direction. As it expands, it compresses the elastomeric material, storing energy in such material. Thus, the material 16 functions in a nature of a spring which is relaxed when the pin element is not within the socket 10, but which is compressed when the pin element is inserted into the socket 10, and in its compressed state exerts a radial inward force on the bushing 18, holding the bushing 18 into tight frictional engagement with the pin. Owing to the construction of the housing 14, the bushing 18, and the elastomeric material the elastomeric material also functions as a resilient buffer between the pin element, and the member to which it is attached, and the housing 14, and the member to which it is attached. The longitudinal splits 39, 40 allow the bushing 18 to expand substantially evenly throughout its full length. The elastomeric material 16 constitutes the only resistance to free expansionof the bushing 18. It exerts a substantially even force on the bushing 18, throughout the full length of the bushing 18.

Accordingly, vibration forces are substantially absorbed by the elastomeric material. The bushing 18 is expanded by insertion of the pin element into the pin bushing 10. However, no further expansion occurs due to vibration forces. Once the pin element is within the bushing 18, the pin element and the bushing 18 are fixed relatively together and they will vibrate together relative to the housing 14. This vibration is abosrbed by the elastomeric material 16.

This connection together of the bushing 18 and the pin 12, so that they will move together in response to vibrations, essentially completely eliminates mechanical wear between these two parts due to vibration. The elastomeric material 16 essentially eliminates the mechanical wear between the bushing 18 and the housing 14.

Referring to FIGS. 4 and 5, the second element of the connection, i.e. the pin element 12, may comprise a threaded base portion 52 for use in connecting it to a second member. The opposite end of the element 12 is in the nature of a uniform diameter pin body 54 which is preferably rounded at its outer end 56. A hex nut section 58 may be provided between threaded base 52 and the pin body 54, to provide a place whereby the pin element 12 may be grabbed by a wrench and turned during its installation and removal to and from the second member. Pin body 54 is larger in diameter than the forming pin.

Referring to FIG. 8, a pair of pin block assemblies 14 may be secured to laterally spaced apart locations at the rear end 59 of a mounting tray 60. A pair of pins 54 are secured to the rear end 62 of an equipment item 64. The equipment item 64 is placed on the tray 60 and is moved rearwardly until the pins 54 are tightly engaged within the bushings 18. The front end of the equipment item 64 is then secured into place in a suitable manner (not shown).

FIG. 7 discloses a modified embodiment. It comprises a mounting block 66 which is secured to a mounting tray 60 in any suitable manner. It may include a backup block 68 which is fastened by a nut and bolt assembly 70 to the mounting tray 60. Mounting block 66 contains a longitudinally split bushing 18 of the type described. Also, a sleeve of elastomeric material 16 is provided between the bushing 18 and the sidewall of the block 66, in the manner described above in connection with the first embodiment. However, in this embodiment, a pin 72 is in an interference fit with the opening through the center of the bushing 18. Pin 72 includes a tapered forward end portion 74. A spring 76 is positioned between the back end of the pin 72 and a front surface of the backup block 68. The pin 72 is free to move laterally in the bushing 18. It is free to move and work, under dynamic loads, in the cross axis directions since it is surrounded by the elastomeric material 16.

An elastomeric compression pad, ball (e.g. silicone rubber) may be substituted for the spring 76.

A shim 78 may be provided to raise the block 66 up off the tray 60, to reduce impacting and dynamic load induction into the assembly.

In this form of the invention, the equipment item 80 includes an opening 82 in line with each pin 72. The openings 82 are smaller in diameter than the pin 72, so they engage the tapered end portion 74 of the pin 72 in the manner illustrated. The equipment item 80 is moved rearwardly to move the openings 82 into engagement with the tapered end portions 74 of the pins 72. The rearward movement of the equipment item 80 moves the pin 72 rearwardly somewhat against the spring 76 (or elastomeric material). Then, the front end of the equipment item 80 is secured in place, as before.

Various details of the specific components which have been illustrated and described can be changed without departing from the spirit of the invention. For example, the shape of housing 14 may vary, the manner in which it is secured to the first member may vary, and the manner in which the pin element 12 is secured to the second element may vary. Accordingly, the embodiment which is disclosed, although constituting the best mode of the invention, is merely illustrative of the inventive principles and is not to be taken to directly limit the protection. Rather, the scope of the invention, and the protection obtained, are to be determined solely by the appended claims and the established rules of claim interpretation.

What is claimed is:

1. For use in the installation of vibration sensitive equipment, a resilient bushing and pin installation, comprising:
    a housing adapted to be connected to a first member, said housing including sidewall means defining an elongated cavity;
    an elongated sleeve of elastomeric material retained within said cavity;
    an elongated, longitudinally split, plastic bushing snugly received wtihin said sleeve of elastomeric material, said bushing presenting a pin receiving socket having an open end at one end of the housing; and
    a metallic pin element adapted to engage a second member and including an elongated pin portion which is pluggable into the pin receiving socket of the plastic bushing, said pin portion being larger in cross sectional dimension than the bushing socket, so that the bushing is radially expanded when the pin portion is inserted into the bushing socket, and the elastomeric material is compressed, resulting in the plastic bushing frictionally gripping the pin portion and the elastic material serving as a resilient buffer between the first and second members, wherein the housing includes an internal flange projecting radially inwardly into the cavity from the sidewall means, and wherein the plastic bushing includes an outwardly projecting flange which is positioned on the side of the housing flange opposite the socket opening, so that said flanges cooperate to prevent axial movement of the bushing out through the socket end of the housing.

2. A pin and socket connection according to claim 1, wherein the end of the housing opposite the open end of the bushing socket includes an opening through which the plastic bushing is inserted, and the connection further includes a cover plate for covering said opening following insertion of the plastic bushing and provides for the retention of the bushing.

3. A pin and socket connection according to claim 1, wherein the housing is a block of metal, said housing including first and second ends, and a first bore extending from the first end towards the second end, a second bore extending from the second end towards the first end, a radial wall between the two bores, and a central opening in the radial wall of a diameter smaller than the diameter of the bores, said first and second bores and the central opening together defining the elongated cavity, and said plastic bushing including first and second ends, said first end defining the open end of the pin receiving socket, said plastic bushing including an elongated body portion of an outside diameter sized to freely pass through the opening in the radial wall in the housing and an outwardly extending radial flange at its second end, said plastic bushing being insertable into the housing through the second end of the housing, and said radial flange on the bushing being sized to be received within the second bore, and said connection further including a cover plate for the second end of the housing which is installed following installation of the plastic bushing, with the radial flange on the plastic bushing being located between the cover plate and the radial wall within the housing following installation of the cover plate.

4. A pin and socket connection according to claim 3, wherein the elongated sleeve of elastomeric material is snugly received within the first bore in the housing and the body portion of the plastic bushing is snugly received within the elastomeric material, wherein the opening in the radial wall is larger in diameter than the outside diameter of the plastic bushing, and wherein the elastomeric material includes a reduced diameter end portion which extends into a space that is defined axially by the thickness of the radial wall and radially between the plastic bushing and the radial wall.

5. A pin and socket connection according to claim 4, wherein the open end of the pin receiving socket is beveled and the pin portion of the pin element includes a leading end which is rounded.

6. A pin and socket connection according to claim 5, wherein the plastic bushing is longitudinally split at several locations one of which extends throughout the full length of the bushing.

7. A pin and socket connection according to claim 5, wherein the outside diameter of the radial flange on the bushing is smaller than the inside diameter of the second bore, so that the flange portion of the bushing is free to expand radially in the second bore when the pin portion of the pin element is inserted into the socket of the bushing.

8. For use in the installation of vibration sensitive equipment, a resilient bushing and pin installation, comprising:
    a housing adapted to be conected to a first member, said housing including sidewall means defining an elongated cavity;
    an elongated sleeve of elastomeric material retained within said cavity;
    an elongated plastic bushing snugly received within said sleeve of elastomeric material, said bushing presenting a pin receiving socket having an open end at one end of the housing;
    a metallic pin element adapted to engage a second member and including an elongated free end pin portion which is pluggable into the pin receiving socket of the plastic bushing, said pin portion being larger in cross sectional dimension than the bushing socket, so that the bushing is radially expanded when the pin portion is inserted into the bushing socket, and the bushing material is compressed, resulting in the bushing frictionally gripping the pin portion and the elastomeric material serving as a resilient buffer between the first and second members, wherein the plastic bushing is longitudinally split at a location which extends throughout the full length of the bushing, and
    wherein the sleeve of elastomeric material retained within said cavity of the housing and said elongated plastic bushing is the only structure present to resist radial expansion of the plastic bushing when the free end pin portion of the pin element is inserted into the bushing socket, resulting in the sleeve of elastomeric material existing as a resilient buffer between the first member to which the housing is connected, and the second member to which the pin element is connected, for absorbing vibration without inducing dynamic impacting loads or mechanical wear.

9. For use in the installation of vibration sensitive equipment, a resilient bushing and pin installation, comprising:
   a housing adapted to be connected to a first member, said housing including sidewall means defining an elongated cavity;
   an elongated sleeve of elastomeric material retained within said cavity;
   an elongated sleeve of elastomeric material retained within said cavity;
   an elongated plastic bushing snugly received within said sleeve of elastomeric material, said bushing presenting a pin receiving socket having an open end at one end of the housing;
   a metallic pin element adapted to engage a second member and including an elongated free end pin portion which is pluggable into the pin receiving socket of the plastic bushing, said pin portion being larger in cross sectional dimension than the bushing socket, so that the bushing is radially expanded when the pin portion is inserted into the bushing socket, and the elastomeric material is compressed, resulting in the bushing frictionally gripping the pin portion and the elastomeric material serving as a resilient buffer between the first and second members, and wherein the bushing is longitudinally split at a location which extends throughout the full length of the bushing, and
   wherein at least one of said open end of the bushing socket and said free end pin portion of said pin element is shaped to cam the pin portion into the bushing socket.

10. A pin and socket installation according to claim 9, wherein the pin portion of the pin element includes a leading end which is rounded.

11. A pin and socket installation according to claim 9, wherein the open end of the bushing socket is beveled.

12. For use in the installation of vibration sensitive equipment a resilient bushing and pin installation, comprising:
   a housing adapted to be connected to a first member, said housing including sidewall means defining an elongated cavity;
   an elongated sleeve of elastomeric material retained within said cavity;
   an elongated plastic bushing snugly received within said sleeve of elastomeric material, said bushing presenting a pin receiving socket having an open end at one end of the housing;
   a metallic pin element adapted to engage a second member and including an elongated free end pin portion which is pluggable into the pin receiving socket of the plastic bushing, said pin portion being larger in cross sectional dimension than the bushing socket, so that the bushing is radially expanded when the pin portion is inserted into the bushing socket, and the elastomeric material is compressed, resulting in the bushing frictionally gripping the pin portion and the elastomeric material serving as a resilient buffer between the first and second members, wherein the bushing is longitudinally split at a location which extends throughout the full length of the bushing, and
   wherein the housing includes an internal flange projecting radially inwardly from the sidewall means into the cavity, and wherein the plastic bushing includes an outwardly projecting flange which is positioned on that side of the housing flange which faces opposite the open end of the socket opening, so that said flanges cooperate to prevent axial movement of the bushing out through the socket opening end of the housing.

13. A pin and socket installation according to claim 12, wherein the housing has another end opposite the open end of the bushing socket, the other end including an opening through which the plastic bushing is inserted, and including a cover plate covering said other end opening for retaining said plastic bushing following insertion of the bushing through said other end opening.

14. A pin and socket installation according to claim 14, wherien the housing is a block of metal, said housing including first and second ends, and a first bore extending from the first end towards the second end, a second bore extending from the second end towards the first end, a radial wall between the two bores, and a central opening in the radial wall of a diameter smaller than the diameter of the bores, said first and second bores and the central opening together defining the elongated cavity, and said plastic bushing including first and second ends, said first end of said bushing defining the open end of the pin receiving socket, said plastic bushing including an elongated body portion of an outside diameter sized to freely pass through the central opening in the radial wall in the housing, said plastic bushing further including an outwardly extending radial flange at the second end of the bushing, said plastic bushing being insertable into the housing through the second end of the housing, and said radial flange on the bushing being sized to be received within the second bore, and said pin and socket installation further including a cover plate covering the second end of the housing, said cover plate being installed following insertion of the plastic bushing into the housing, with the radial flange of the plastic bushing being located between the cover plate and the radial wall within the housing 15. A pin and socket installation according to claim 14, wherein the elongated sleeve of elastomeric material has an outside diameter sized so that such sleeve is snugly received within the first bore in the housing, and the body portion of the plastic bushing is snugly received within the elastomeric material, and wherein the elastomeric material includes a reduced diameter end portion which extends into a space that is defined axially by the thickness of the radial wall, and radially by the distance between the outside diameter of the plastic bushing and the diameter of the central opening in the radial wall.

16. A pin socket installation according to claim 15, wherein the open end of the bushing socket is beveled and the pin portion of the pin element includes a leading end which is rounded.

17. A pin and socket installation acording to claim 16, wherein the plastic bushing is longitudinally split at several locations, and wherein the plastic bushing has at least one longitudinal split extending along the full length of the bushing and through the bushing's radial flange.

18. A pin and socket installation according to claim 17, wherein the outside diameter of the radial flange of the plastic bushing is smaller than the inside diameter of the second bore, so that the bushing's radial flange is free to expand radially in the second bore when the pin portion of the pin element is inserted into the bushing socket.

* * * * *

UNITED STATES PATENT AND TRADEMARK OFFICE
CERTIFICATE OF CORRECTION

PATENT NO. : 4,647,245

DATED : March 3, 1987

INVENTOR(S) : Francis X. Konsevich

It is certified that error appears in the above-identified patent and that said Letters Patent are hereby corrected as shown below:

Column 1, line 15, before the heading "BACKGROUND INFORMATION", insert this paragraph:

-- This invention was made with Government support under Contract No. F33615-81-C-0213 awarded by the United States Air Force. The Government has certain rights in this invention. --

Signed and Sealed this

Third Day of January, 1989

*Attest:*

DONALD J. QUIGG

*Attesting Officer*     *Commissioner of Patents and Trademarks*